United States Patent
Franz et al.

(10) Patent No.: US 10,100,427 B2
(45) Date of Patent: Oct. 16, 2018

(54) HYBRID CRUCIBLE FOR CRYSTALLIZING MATERIALS

(71) Applicant: ALD VACUUM TECHNOLOGIES GMBH, Hanau (DE)

(72) Inventors: Henrik Franz, Freigericht (DE); Christoph Morche, Mainaschaff (DE); Andreas Zimmermann, Hanau (DE); Armin Wengerter, Klingenberg (DE); Kai Müller, Biebergemünd (DE); Michael Hohmann, Hanau (DE)

(73) Assignee: ALD VACUUM TECHNOLOGIES GMBH, Hanau (DE)

( * ) Notice: Subject to any disclaimer, the term of this patent is extended or adjusted under 35 U.S.C. 154(b) by 0 days.

(21) Appl. No.: 15/123,284

(22) PCT Filed: Mar. 6, 2015

(86) PCT No.: PCT/EP2015/054762
§ 371 (c)(1),
(2) Date: Sep. 2, 2016

(87) PCT Pub. No.: WO2015/132399
PCT Pub. Date: Sep. 11, 2015

(65) Prior Publication Data
US 2017/0058426 A1    Mar. 2, 2017

(30) Foreign Application Priority Data
Mar. 6, 2014 (DE) .......... 10 2014 102 980

(51) Int. Cl.
*C30B 11/00* (2006.01)
*C30B 35/00* (2006.01)
(Continued)

(52) U.S. Cl.
CPC .......... *C30B 11/002* (2013.01); *C30B 11/003* (2013.01); *C30B 11/14* (2013.01); *C30B 29/06* (2013.01); *C30B 35/002* (2013.01)

(58) Field of Classification Search
CPC combination set(s) only.
See application file for complete search history.

(56) References Cited

U.S. PATENT DOCUMENTS

2008/0230678 A1* 9/2008 Sakai .................. B22C 9/00
                                                     249/160
2009/0013925 A1* 1/2009 Servant .............. C30B 11/003
                                                     117/206
(Continued)

FOREIGN PATENT DOCUMENTS

DE    10 2009 015 236 A1    10/2010
DE    10 2011 052 016 A1    1/2013
(Continued)

OTHER PUBLICATIONS

Machine translation of JP2006-282495.*
English Translation of Japanese Office Action.

*Primary Examiner* — Erin F Bergner
(74) *Attorney, Agent, or Firm* — Hudak, Shunk & Farine Co., LPA

(57) ABSTRACT

A hybrid crucible comprising a frame and a bottom plate. The crucible is characterized by the selection of material of these two components, which have been optimized in terms of thermal conductivity. The crucible is adapted to produce crystalline materials. Moreover, a method for producing crystalline material is disclosed.

14 Claims, 2 Drawing Sheets

(51) Int. Cl.
*C30B 29/06* (2006.01)
*C30B 11/14* (2006.01)

(56) References Cited

U.S. PATENT DOCUMENTS

| | | |
|---|---|---|
| 2011/0180229 A1 | 7/2011 | Phillips et al. |
| 2012/0037065 A1 | 2/2012 | Wagner et al. |
| 2015/0056123 A1 | 2/2015 | Hu et al. |

FOREIGN PATENT DOCUMENTS

| | | |
|---|---|---|
| DE | 10 2012 102 597 A1 | 9/2013 |
| EP | 1 717 201 A1 | 11/2006 |
| JP | 2006-282495 A | 10/2006 |
| JP | 2011073915 A | 4/2011 |
| JP | 2015-020941 A | 2/2015 |
| WO | 2007148986 A1 | 12/2007 |
| WO | 2010105617 A2 | 9/2010 |
| WO | 2010112259 A1 | 10/2010 |
| WO | 2011120598 A1 | 10/2011 |
| WO | 2013112231 A1 | 8/2013 |
| WO | 2013143972 A1 | 10/2013 |
| WO | 2013149560 A1 | 10/2013 |

* cited by examiner

HYBRID CRUCIBLE FOR CRYSTALLIZING MATERIALS

FIELD OF THE INVENTION

The present invention relates to a hybrid crucible for melting and crystallizing certain materials, in particular silicon. The invention also relates to a method for melting and crystallizing the materials in question.

BACKGROUND OF THE INVENTION

In the prior art primarily crucibles of silicon dioxide (quartz ceramics) are used for these purposes. In the crucibles of the prior art, the material to be melted is completely melted. To prevent leakage of the melt, these crucibles are constructed monolithically, i.e. frame and bottom plate are firmly joined together. In other words, crucibles of the prior art are typically made of silicon dioxide, whereby the thermal conductivity toward the bottom and towards the sides is equal. The crucibles used in the prior art require a massive increase in the temperature gradient toward the main heat flow during the solidification process. This massive increase of the temperature gradient reduces the degrees of freedom in the configuration of the crystallization process. In addition, unwanted crystal growth can be induced, which deviates from the main direction of growth and can reduce the yield of high quality material particularly in the field of the production of crystalline silicon. In the prior art, usually the Bridgman method or VGF-(Vertical Gradient Freeze) technology is used for the production of crystalline silicon ingots.

Particular attention must be paid to ensure that the melt is not contaminated by impurities. In the case of silicon for photovoltaics this would lead to a deterioration in efficiency and to a reduced yield.

Another major disadvantage of the crucibles of the prior art is that the entire crucible is damaged during the process by phase transitions and the associated changes in volume. Currently, the crucibles used must be loaded manually very carefully and cautiously. In the case of incorrect production and/or improper loading of the crucible damaged spots can result in failure and thus consequently to leakage of the melt already during the melting process. The further increases in the batch sizes to be expected and the associated crucible enlargements will lead to a further exacerbation of these problems.

The document US 2008/0196656 A1 describes crucibles made of quartz ceramics which are provided with several coatings and are suitable for the production of crystalline silicon ingots. The coating of the crucibles is intended to prevent the formation of cracks and fractures in the silicon ingot and to allow extraction of the crystallized silicon ingot without damaging the crucible. These crucibles, however, have a monolithic structure and the thermal conductivities of the bottom and the side walls are identical, resulting in the disadvantages described above. Moreover, the production of such crucibles is very complicated and therefore very expensive. $SiO_2$ crucibles of the prior art are therefore usually destroyed because the initially amorphous silicon dioxide is converted by heat impact into a crystalline state (high temperature cristobalite). This crystalline state is transformed into the so-called low temperature cristobalite during cooling. This transformation is accompanied by a volume change which leads to the destruction of the crucible.

The document JP 2000 351 688 A likewise describes crucibles made of quartz ceramics and their manufacture. The crucibles are suitable for the production of silicon ingots. The crucibles have a curved inner bottom which is bordered by a flat outer bottom. This arrangement is intended to ensure the complete contact of the crucible with a cooling plate to allow a uniform cooling of the crucible bottom. This serves to form a uniform solidification front in the directed crystallization of silicon ingots in the Bridgman method and should enable the production of silicon ingots with an increased height. These crucibles are also constructed monolithically and bring along the above-described disadvantages.

The document US 2011/0180229 A1 describes crucibles, in which a bottom plate is inserted into the frame of the crucible. In this case, a firm connection of the bottom plate to the frame by a form fit and by a further material bond is provided. The crucible frame is therefore not set onto the bottom plate and a separation of the bond between the crucible frame and the bottom plate is labor-intensive. Thus, a quick exchange of the frame is not possible. In addition, the bottom plate must be tailored to the frame. These crucibles are therefore difficult to handle and expensive to produce.

The document DE 10 2011 052 016 A1 describes a kit for carbide ceramic crucibles. Such a kit provides the firm connection of the bottom plate and side elements by form fit and material bond, wherein the frame is also not set onto the bottom plate. An increased thermal conductivity of the bottom plate of such a crucible is not provided. Thus, such a finished crucible basically corresponds to the design of a monolithic crucible and brings about the corresponding above-mentioned disadvantages.

The document DE 10 2012 102 597 A1 describes a process for producing a directionally solidified material body. In this case a crucible is prepared such that its bottom is covered with a plurality of thin monocrystalline seed crystal plates. This should lead to a directional crystallization of quasi-monocrystalline metal or semi-metal bodies. The crucibles described are also constructed monolithically and bring about the disadvantages described.

Thus, there is a need to improve the melting and crystallization so that a better control of the direction of crystal growth is enabled while improving and accelerating the establishment of the crystallization rate. Furthermore, the process should be optimized so that the costs of the crucible are minimized. It is the object of the present invention to provide these improvements.

SUMMARY OF THE INVENTION

This object is solved by the subject matter of the claims.

According to the invention a hybrid crucible for the crystallization of materials is provided, comprising a bottom plate and a frame, wherein the bottom plate and the frame are made of different materials, the thermal conductivity of the bottom plate is greater than that of the frame and the frame is set onto the bottom plate. Due to the difference of the thermal conductivities of the bottom plate and the frame the temperature gradient between the center and the edges of the crystallization front is kept negligibly small over the entire crystallization height, so that during the entire crystallization a preferred growth direction of the crystals or the crystal is established vertically from the bottom up in the entire ingot. Undesired lateral crystal growth which would reduce the yield of crystalline material is avoided.

According to the invention the frame is set onto the bottom plate. This means, that the bottom plate and the frame are not manufactured from one piece as is common in the prior art, but are releasably connected to each other. The releasable connection according to the invention consists in the fact that the frame is only set onto the bottom plate. Preferably, there is no form fit and/or material bond between frame and bottom plate.

Because of the specific embodiment of the method according to the invention for melting and crystallization it is not necessary to establish a firm connection between the bottom plate and the frame. In particular, according to the invention a form fit and/or material bond is preferably not necessary and not present. The background is that the material to be melted and crystallized is preferably not melted down to the bottom plate of the hybrid crucible, but a solid bottom layer of generic material remains on the bottom plate so that on the one hand it seals the gap between the frame and the bottom plate and on the other hand protects the bottom plate against the attack of the material. This does not exclude, that the frame is releasably connected to the bottom plate, for example via a screw connection, a downholder or by other measures known in the art, thus, there is preferably provided a means for a releasable connection. In one embodiment, however, even such means are not provided.

This embodiment also enables the use of the bottom plate for more than one crystallization process. Finally, the bottom plate is protected from attack by the melt by means of the solid bottom layer of generic material. The frame, which in one embodiment of the present invention is not protected by a layer of generic material, can be replaced after one melting cycle, provided a significant removal is effected by the melt or conversion processes have led to a damage of the crucible which makes a further use unsure.

It has proved advantageous to use a material for the frame which has a thermal conductivity at 0° C. of not more than 30 W/(m*K), more preferably at most 20 W/(m*K), more preferably at most 10 W/(m*K). It is further preferred that the thermal conductivity of the frame at 0° C. has a value of not more than 5 W/(m*K), more preferably at most 3 W/(m*K). A too high thermal conductivity of the frame impedes the directional solidification in the preferred direction. Measuring methods for determining the thermal conductivity of the materials are known in the art.

The difference in thermal conductivity between the frame and the bottom plate should be at least 10 W/(m*K). It has proved to be particularly advantageous to select the materials so that the thermal conductivity of the bottom plate is greater than the thermal conductivity of the frame at least by a factor of 1.1, more preferably at least 1.3, more preferably at least 1.5 and particularly preferably at least 2. Unless otherwise specified, the thermal conductivity is determined at 0° C.

Materials which are suitable as a material of the frame, are in particular oxide ceramic materials. According to the invention it is particularly preferred to use silica for this purpose. The frame is preferably provided with a protective layer, in particular with a protective nitride layer, preferably of silicon nitride. Such a protective layer behaves substantially inert with respect to the melt and can withstand very high temperatures. The thermal conductivity of the material of the bottom plate at 0° C. is preferably >10 W/(m*K), more preferably at least 13 W/(m*K), more preferably at least 20 W/(m*K), even more preferably at least 25 W/(m*K), and most preferably at least 30 W/(m*K). In preferred embodiments of the present invention the thermal conductivity is even higher, in particular at least 40 W/(m*K), and more preferably at least 50 W/(m*K).

In particularly preferred embodiments, the bottom plate is made of a material which is solid at the melting temperature of the material to be crystallized, and is in particular made of a metallic material. This includes metals and metal alloys. The melting temperature of the material of the bottom plate is preferably above 600° C., more preferably above 800° C., more preferably above 1000° C. and more preferably above 1200° C. The present invention preferably relates to the production of crystalline silicon. Therefore, for the bottom plate preferably materials are used which withstand temperatures of over 1410° C. without any damage. In an alternative embodiment the bottom plate substantially consists of a graphite-containing material, in particular graphite. Preferably, the bottom plate is not made of a ceramic material, in particular not made of an oxide ceramic material.

The use of a herein-described hybrid crucible in a process for producing crystalline materials, in particular single-crystalline or polycrystalline materials (especially silicon), is also within the scope of this invention.

The inner diameter of the hybrid crucible is preferably at least 10 cm, more preferably at least 30 cm and particularly preferably at least 50 cm and particularly at most 400 cm, more preferably at most 300 cm and particularly preferably at most 200 cm. This refers to the respective largest inner diameter.

According to the invention, moreover, a process for producing crystalline material is provided, comprising the steps of:
A. filling raw material into a hybrid crucible according to the invention,
B. heat input, so that the material melts from top to bottom,
C. solidification of the melt to form a crystalline product, wherein throughout the process a fraction of unmelted material remains on the bottom plate.

The addition of the raw material and the charging can be implemented in a solid or already molten form. The crystalline product may be mono- or polycrystalline. The heat input is effected preferably by means of a heating device, which is in particular selected from one or more resistance and/or induction heaters.

Prior to the filling of the raw material a so-called seed material can be introduced, which is also made of the raw materials used, however, if appropriate, with a smaller particle size. This seed material is not or not completely liquefied during the melting process but remains as a solid bottom layer or fraction of unmelted material on the bottom plate.

An embodiment of the invention provides for the use of a protective frame which is set onto the bottom plate prior to the filling of the raw material. The protective frame is removed prior to the heat input or prior to the melting process. It serves to protect the frame during the filling of the raw material in order to avoid damages to the frame by the often sharp-edged raw materials. In one embodiment in a first step the protective frame is set onto the bottom plate, subsequently the seed material is supplied and then the raw material is filled into the protective frame. The filling process can be implemented by simple pouring—even by machine—because there is no need to pay attention to the integrity of the frame. The frame itself may already be set onto the bottom plate at the time of filling and surround the protective frame or can be disposed over the protective frame only after the filling process. In any case, the frame sits on the bottom plate when the protective frame is removed.

Thus, a preferred method according to the invention comprises the following steps:
A. setting the protective frame onto the bottom plate,
B. optionally filling seed material onto the bottom plate within the protective frame,
C. filling of raw material onto the seed material,
D. removing the protective frame,
E. heat input, so that the material melts from top to bottom,
F. solidification of the melt to form a crystalline product,
wherein throughout the entire process a fraction of unmelted material remains on the bottom plate and the frame is set onto the bottom plate not later than the time of melting of the raw material.

In the present embodiment the heat input into the hybrid crucible during melting occurs so that the raw material is melted toward the bottom plate from top to bottom. A fraction of unmelted material, the so-called solid bottom layer, remains on the bottom plate. The temperature at the bottom plate, thus, preferably remains below the melting temperature of the material. During crystallization the temperature distribution is preferably set so that the crystal growth occurs from bottom to top.

Because a solid bottom layer remains on the bottom plate of the hybrid crucible, there are various advantages. On the one hand, the crucible may be configured such that a firm connection between the frame and the bottom plate is not required, because the material of the solid bottom layer results in a sealing of the gap between the frame and the bottom plate. There is no need to implement a sealing, a form fit and/or a material bond prior to the start of the process. Furthermore, the solid bottom layer on the bottom plate protects the bottom plate against the attack of the melt. This allows on the one hand use of a material for the bottom plate which would otherwise not be suited for the use in such a crucible due to lack of resistance or risk of contamination. In addition, contamination of the melt in the bottom region of the hybrid crucible is effectively avoided. This considerably reduces the requirements on the material of the base plate.

The frame and/or the protective frame according to the invention are preferably assembled monolithically or from individual components. "Monolithic" means it need not to be assembled from several individual components, but is made of one piece. The frame opens towards the bottom plate.

Overall, with the method according to the present invention by use of the hybrid crucible according to the invention a product is obtained, which in view of the products of the prior art has a better quality with less impurities, at least, however, the same quality with reduced manufacturing costs. In addition, it is expected that for the predicted increases in batch size, the monolithic crucibles will reach limits with respect to a safe handling and degrees of freedom in the process control. The product according to the invention may be mono- or polycrystalline. The method is overall more economical since the material yield is significantly increased due to less contamination and unwanted crystal growth.

Furthermore, the bottom plate of the crucible can be used repeatedly, because it is protected against the attack of the melt by means of the solid bottom layer. In a preferred embodiment of the method according to the invention subsequently to the solidification a step of removing the product is implemented, and then the frame of the hybrid crucible is preferably replaced. The bottom plate can be reused.

After completion of the crystallization or solidification of the melt the frame can be removed, in particular lifted upwardly so that the solidified or crystallized body remains on the bottom plate and can be supplied to a further processing.

The generic material of the solid bottom layer also prevents a contamination of the melt by the material of the bottom plate. The preferably two-part hybrid crucible offers opportunities and approaches for a more reliable charging of the raw material, because a coating for the bottom plate—in contrast to the prior art—is not necessary and preferably not provided. Crucibles of the prior art usually have a coating in order to prevent the contact of the melt with the crucible. Thus, charging of the crucible with raw material has to be implemented very carefully in order to avoid a damage of the coating. According to the invention a coating is not necessary and preferably absent. This is also related to the fact that a less brittle material can be used for the bottom plate than in the prior art. The ceramic crucible of the prior art can easily be damaged during charging which can result in disastrous consequences for the crucible.

In a preferred embodiment the hybrid crucible in addition to the frame comprises an additional protection frame which is used only during the filling of the raw material and/or the seed material. The protective frame fits into the frame with respect to its dimensions so that it protects the inner wall of the frame from damage during the filling of the raw material. It is preferably shaped so that it fits precisely into the frame with respect to its length and width, that is to say that between the outer side of the protective frame and the inner side of the frame a distance of preferably not more than 15 mm, more preferably not more than 10 mm and particularly preferably not more than 5 mm remains. The walls of the protective frame have a thickness of preferably 2 to 50 mm, more preferably 3 to 25 mm and particularly preferably 5 to 15 mm. This wall thickness has been found to be sufficient. The protective frame should not be too thick in order to avoid that a too wide gap remains between the frame and the filled material. The protective frame has a height which preferably corresponds to at least the filling level of the raw material in the frame. The protective frame, for example, can exceed the frame in height, have the same height or can be slightly lower than the frame.

In a preferred embodiment of the method the protective frame is positioned in the frame prior to the filling of the raw material and/or the seed material, so that the protective frame is preferably set onto the bottom plate, too. Alternatively, the protective frame can also be set onto the bottom plate prior to arranging the frame. The protective frame then remains on the bottom plate during the filling of the raw material and/or the seed material, so that the inner wall of the frame is protected from damage by sharp edges of the raw material. This is particularly of great advantage for sharp-edged silicon as a raw material.

The protective frame may preferably be removed from the area within the frame after the filling of the raw material and/or the seed material and in particular prior to the heat input or the melting process. The protective frame then only serves to protect the frame during the filling of the material. Thus, the lifetime of the frame is prolonged and the risk of contamination of the material to be melted is reduced. After removal of the protective frame a small gap remains between the filled material and the inner wall of the frame. Of course, this gap is closed during the melting process.

By the use of the protective frame an automated filling of the hybrid crucible can be implemented, because it is no longer required to fill with particular care. The protective frame may be used repeatedly, particularly if it is made of silicon, since in this case it will not induce any contamination, even if it is damaged.

The protective frame itself can be made of a material that resists the mechanical load from sharp-edged raw material. It does not necessarily have to be heat resistant, but should be inert to the raw material, i.e. it should not cause contamination. In one embodiment the protective frame is made of a material (such as a metal) that is coated with silicon, or of silicon. Alternatively, other materials may be used such as nitride coated metals.

In a preferred embodiment the bottom plate is made of a composite material, in particular of a gradient material. The bottom plate, thus, can have a specific distribution of thermal conductivity within the material. The composite material may be a laminate material. The bottom plate can have locally different thermal conductivities, so that locally different heat flows can be established.

Figure 1:
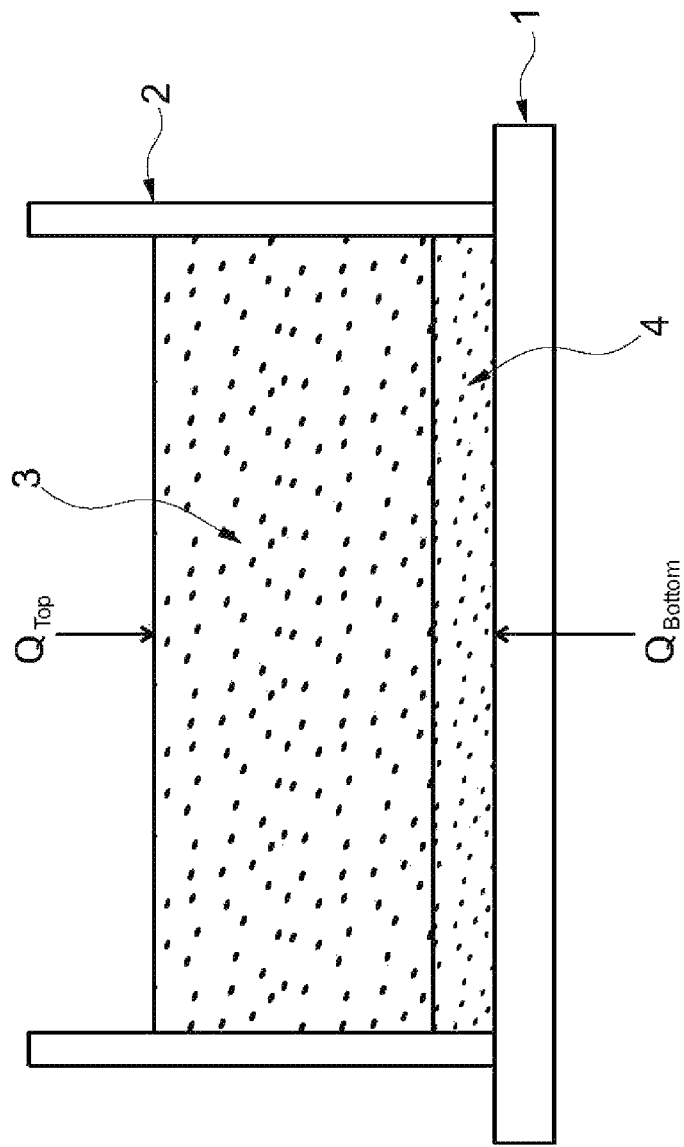
FIG. 1 shows a cross sectional view of the hybrid crucible according to the invention comprising a bottom plate 1 and a frame 2 which is set onto the bottom plate. In the hybrid crucible there is a melt 3 and a solid bottom layer 4 of generic material. The term "generic" material means that the material is the same as that of the melt. The solid bottom layer thus consists of the same material as the melt above. In this figure the melting phase is shown in the method according to the invention. During the melting phase heat is preferably supplied both from the top $Q_{Top}$ and from the bottom $Q_{Bottom}$. No heat is preferably applied through the frame because it has a lower thermal conductivity.
Figure 2:
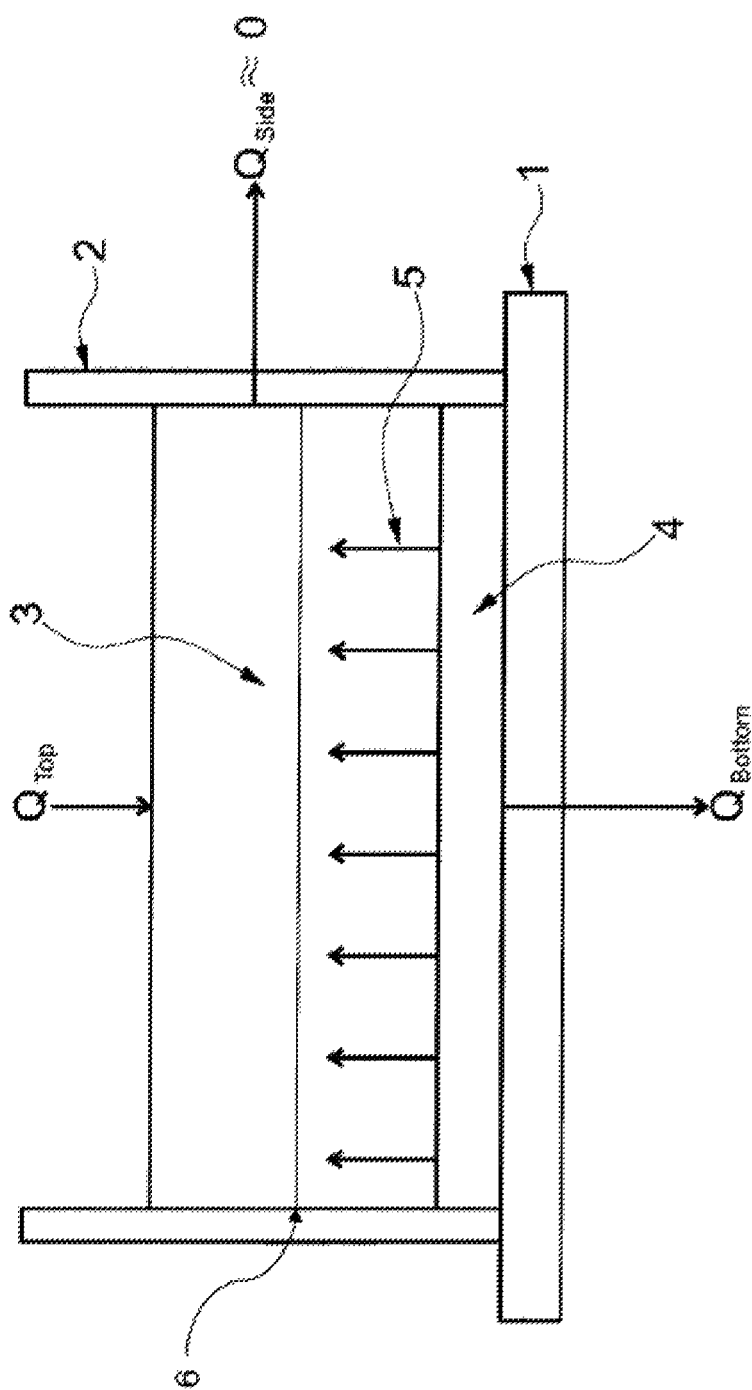
FIG. 2 like FIG. 1 shows a cross sectional view of the hybrid crucible according to the invention comprising a bottom plate 1, a frame 2, the melt 3 and the solid bottom layer 4. The arrows 5 indicate the direction of crystal growth at the crystallization front 6. During the crystallization phase, which is shown in this figure, a heat flow is realized through the bottom plate by the combination of heating and cooling, which in first consequence leads to the establishment of a temperature gradient and in a further consequence to a directional solidification. Heat is supplied continuously from the top ($Q_{Top}$). The heat dissipation through the frame ($Q_{Side}$) is low.

Due to the fact that the frame exhibits an insulating effect, the energy discharge at the sides is very low. Consequently, a temperature gradient is achieved only between the crystallization front and the bottom plate. The crystal growth thus only occurs from the bottom up.

LIST OF REFERENCE SYMBOLS

1 Bottom plate
2 Frame
3 Melt
4 Solid bottom layer
5 Direction of crystal growth
6 Crystallization front

What is claimed is:

1. A hybrid crucible for the crystallization of materials, comprising a bottom plate and a frame, wherein the bottom plate and the frame are made of different materials, the thermal conductivity of the bottom plate is greater than that of the frame and the frame is set onto the bottom plate, and wherein a coating on the bottom plate is absent and the crucible is designed such that a solid bottom layer of generic material can be formed on the bottom plate, which protects the bottom plate against the attack of the melt, and wherein the frame is set onto the bottom plate without establishing a firm connection, a form fit or a material bond between the frame and the bottom plate prior to use of the crucible.

2. The hybrid crucible according to claim 1, wherein the bottom plate has a thermal conductivity which is greater than that of the frame by at least a factor of 1.1.

3. The hybrid crucible according to claim 1, wherein the bottom plate is made of a gradient material.

4. The hybrid crucible according to claim 1, wherein the bottom plate has locally different thermal conductivities, so that locally different heat flows can be established.

5. The hybrid crucible according to claim 1, wherein the frame has a thermal conductivity at 0° C. of not more than 5 W/(m*K).

6. The hybrid crucible according to claim 1, wherein the bottom plate has a thermal conductivity at 0° C. of at least 40 W/(m*K).

7. A method for producing crystalline material, comprising the steps of: a. filling raw material, particular silicon raw material, into a hybrid crucible according to claim 1 comprising a bottom plate and a frame, wherein the bottom plate and the frame are made of different materials, the thermal conductivity of the bottom plate is greater than that of the frame and the frame is set onto the bottom plate, and wherein a coating on the bottom plate is absent and the crucible is designed such that a solid bottom layer of generic material can be formed on the bottom plate, which protects the bottom plate against the attack of the melt, and wherein the frame is set onto the bottom plate without establishing a firm connection, a form fit or a material bond between the frame and the bottom plate prior to use of the crucible, b. in parting heat to the hybrid crucible, so that the raw material is melted from top to bottom, c. directionally solidifying the melt to form a crystalline product, and wherein a fraction of unmelted material remains on the bottom plate throughout the process.

8. The method according to claim 7, wherein the method further comprises the following step, before step a), introducing a seed-material, consisting of the same material as the raw materials, which is chosen such that it is not or not completely liquefied during the melting process and it remains as a solid bottom layer or fraction of unmelted material on the bottom plate.

9. The method according to claim 7, wherein an additional protective frame is arranged on the bottom plate prior to the filling step.

10. The method according to claim 9, wherein the protective frame is set onto the bottom plate prior to setting the frame onto the bottom plate.

11. The method according to claim 10, wherein the protective frame is removed prior to the heat input.

12. The method according to claim 7, wherein the frame is replaced after removal of the crystalline material and the method is then carried out again with a new frame.

13. The hybrid crucible according to claim 5, wherein the frame has a thermal conductivity at 0° C. of not more than 3 W/(m*K).

14. The hybrid crucible according to claim 6, wherein the bottom plate has a thermal conductivity at 0° C. of at least 50 W/(m*K).

\* \* \* \* \*